US009620382B2

(12) United States Patent
Oehrlein et al.

(10) Patent No.: US 9,620,382 B2
(45) Date of Patent: Apr. 11, 2017

(54) REACTOR FOR PLASMA-BASED ATOMIC LAYER ETCHING OF MATERIALS

(71) Applicant: University of Maryland, College Park, College Park, MD (US)

(72) Inventors: Gottlieb S. Oehrlein, Clarksville, MD (US); Dominik Metzler, College Park, MD (US)

(73) Assignee: UNIVERSITY OF MARYLAND, COLLEGE PARK, College Park, MD (US)

( * ) Notice: Subject to any disclaimer, the term of this patent is extended or adjusted under 35 U.S.C. 154(b) by 0 days.

(21) Appl. No.: 14/563,566

(22) Filed: Dec. 8, 2014

(65) Prior Publication Data

US 2015/0162168 A1 Jun. 11, 2015

Related U.S. Application Data

(60) Provisional application No. 61/913,013, filed on Dec. 6, 2013.

(51) Int. Cl.
| | |
|---|---|
| *H01L 21/311* | (2006.01) |
| *C23C 16/455* | (2006.01) |
| *C23C 16/52* | (2006.01) |
| *H01J 37/32* | (2006.01) |

(52) U.S. Cl.
CPC .. *H01L 21/31116* (2013.01); *H01J 37/32082* (2013.01); *H01J 37/32146* (2013.01)

(58) Field of Classification Search
None
See application file for complete search history.

(56) References Cited

U.S. PATENT DOCUMENTS

| | | | | |
|---|---|---|---|---|
| 2013/0105303 A1* | 5/2013 | Lubomirsky | ..... | H01J 37/32091 204/192.34 |
| 2013/0115778 A1* | 5/2013 | Xue | ..... | H01L 21/02181 438/703 |
| 2013/0137267 A1* | 5/2013 | Chang | ..... | H01J 37/3244 438/694 |
| 2014/0263180 A1* | 9/2014 | Moffatt | ..... | C23C 16/46 216/62 |
| 2015/0042973 A1* | 2/2015 | Mack | ..... | G03F 7/704 355/71 |

* cited by examiner

*Primary Examiner* — Shamim Ahmed
(74) *Attorney, Agent, or Firm* — Squire Patton Boggs (US) LLP

(57) ABSTRACT

Plasma-based atomic layer etching of materials may be of benefit to various semiconductor manufacturing and related technologies. For example, plasma-based atomic layer etching of materials may be beneficial for adding and/or removing angstrom thick layers from a surface in advanced semiconductor manufacturing and related technologies that increasingly demand atomistic surface engineering. A method may include depositing a controlled amount of a chemical precursor on an unmodified surface layer of a substrate to create a chemical precursor layer and a modified surface layer. The method may also include selectively removing a portion of the chemical precursor layer, a portion of the modified surface layer and a controlled portion of the substrate. Further, the controlled portion may be removed to a depth ranging from about 1/10 of an angstrom to about 1 nm. Additionally, the deposition and selective removal may be performed under a plasma environment.

17 Claims, 14 Drawing Sheets

REACTOR FOR PLASMA-BASED ATOMIC LAYER ETCHING OF MATERIALS

CROSS-REFERENCE TO RELATED APPLICATIONS

This application is related to and claims the benefit and priority of U.S. Provisional Patent Application No. 61/913,013, filed Dec. 6, 2013, which is hereby incorporated by reference in its entirety.

GOVERNMENT LICENSE RIGHTS

This invention was made with government support under CBET1134273 awarded by the NSF. The government has certain rights in the invention.

BACKGROUND

Field

Plasma-based atomic layer etching of materials may be of benefit to various semiconductor manufacturing and related technologies. For example, plasma-based atomic layer etching of materials may be beneficial for removing angstrom thick layers from a surface in advanced semiconductor manufacturing and related technologies that increasingly demand atomistic surface engineering.

Description of the Related Art

While atomic layer deposition has been tremendously successful, the development of a corresponding atomic layer etching (ALE) method has lagged. In atomic layer deposition, control of deposited film thickness near one atomic monolayer may be based on careful choice of chemical precursors which, once adsorbed at one monolayer on the substrate, passivate the surface and prevent multi-layer adsorption.

A subsequent reaction step transforms the precursor into the desired material. Experimental and computational efforts aimed at realizing a corresponding ALE approach using cyclic surface passivation followed by removal of weakly bound chemical reaction products resulting from interaction of the passivation layer with the surface have been started in the past. These efforts have shown that a key obstacle toward realizing ALE is achieving self-limited etching, in particular for situations when ion bombardment to remove the reacted material and precise control of surface coverage by the chemical precursor is required.

Self-limited etching can require both negligible spontaneous chemical etching by the precursor used to passivate the surface, and insignificant physical sputtering of the unmodified material after etch product removal. Minimizing physical sputtering has been difficult to realize consistently, and additional factors, such as, for example, photon-induced etching for plasma environments, have also been invoked in an attempt to explain persistent etching for certain conditions.

SUMMARY

According to certain embodiments, a method may include depositing a controlled amount of a chemical precursor on an unmodified surface layer of a substrate to create a chemical precursor layer and a modified surface layer. The method may also include selectively removing a portion of the chemical precursor layer, a portion of the modified surface layer and a controlled portion of the substrate. Further, the controlled portion may be removed to a depth ranging from about 1/10 of an angstrom to about 1 nm. Additionally, the deposition and selective removal may be performed under a plasma environment.

According to certain embodiments, an apparatus may include a coupled plasma system containing a chemical precursor to be energized by the plasma and deposited on a substrate. The apparatus may also include a power source configured to supply a radio frequency bias potential to the substrate. The apparatus may further include a controller configured to control an amount of the chemical precursor applied to the substrate to create a chemical precursor layer and a modified surface layer, and the coupled plasma system and the power source to selectively remove a portion of the chemical precursor layer, a portion of the modified surface layer and a controlled portion of the substrate. Further, the controlled portion may be removed to a depth ranging from about 1/10 of an angstrom to about 1 nm. Additionally, the application of the chemical precursor and the selective removal may be performed under a plasma environment.

According to certain embodiments, an apparatus may include means for depositing a controlled amount of a chemical precursor on an unmodified surface layer of a substrate to create a chemical precursor layer and a modified surface layer. The apparatus may also include means for selectively removing a portion of the chemical precursor layer, a portion of the modified surface layer and a controlled portion of the substrate. Further, the controlled portion may be removed to a depth ranging from about 1/10 of an angstrom to about 1 nm. Additionally, the deposition and selective removal may be performed under a plasma environment.

BRIEF DESCRIPTION OF THE DRAWINGS

For proper understanding of the invention, reference should be made to the accompanying drawings, wherein:

FIG. 7(*b*) illustrates removal of $SiO_2$ per cycle, according to certain embodiments.

DETAILED DESCRIPTION

Figure 1A:
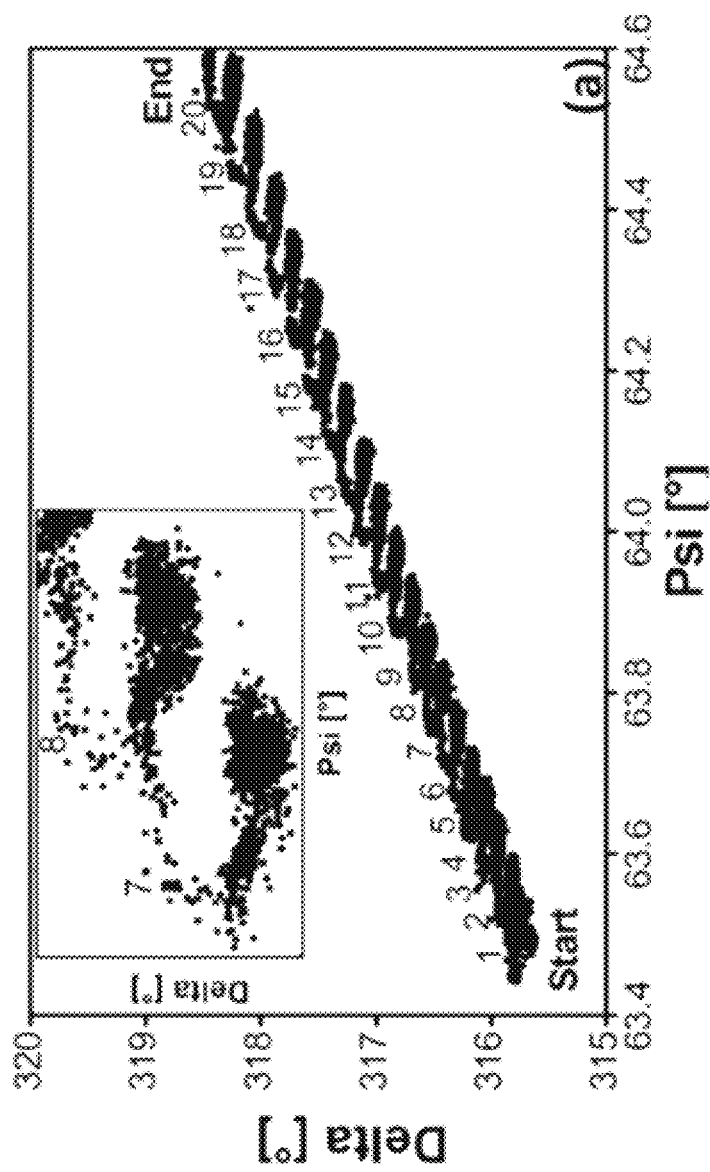
FIG. 1(a) illustrates real-time ellipsometry measurements for selected conditions of an etching approach, according to certain embodiments.

According to certain embodiments, it may be possible to study and evaluate the use of cyclic plasma interacting with a substrate. For example, cyclic $Ar/C_4F_8$ plasma interacting with a substrate can be explored to determine for what conditions controlled removal of substrate layers approaching one atomic layer thickness per cycle can be achieved. Conditions for the removal of substrate layers ranging from about 1/10 of an angstrom to about 1 nm can be achieved. In other embodiments, time-resolved surface characterization can be implemented to confirm ALE.

The term atomic layer etching, as used herein, can broadly refer to the level of layer dimensional control that can be achieved at the angstrom level. Thus, atomic layer etching may generally correspond to the size of atoms. Additionally, the average removed layer thickness/cycle can be less than 1 angstrom per etching cycle, or more than 1 angstrom/cycle.

Various substrates may be used in studying and evaluating the use of cyclic plasma interacting with the substrate. For example, such substrates may include materials that show chemically enhanced etching in the presence of low energy bombardment and a chemical precursor. The substrates can also include at least one of $SiO_2$, $Si_3N_4$, c-Si, amorphous Si, poly-crystalline Si, $Si_xGe_{1-x}$, GaAs or other group III-V semiconductors, $GaAl_xAs_{1-x}$, InGaAs, $GaP_xAs_{1-x}$, or the oxides, nitrides, or oxynitrides of any of the above listed substrate materials, or can be similar or like materials other than those listed above. Additionally, the substrate may have a native oxide layer on the surface of the substrate. Moreover, a thickness of the native oxide layer may vary. For example, the thickness of the native oxide layer may be about 1/10 of 1 nm to about 10 nm.

In other embodiments the substrate may also include high-k dielectric films, or low-k dielectric films, with or without nanopores. The high-k dielectric films may include $Al_2O_3$, $HfO_2$ or Hf-silicate. The low-k dielectric films may include at least one of SiCOH, $SiO_yF_x$, or polymeric low-k dielectric films, with or without nanopores. Moreover, in certain embodiments, the substrate may further include at least one of graphene, graphite and other forms of carbon, deposited on a Si or silicon-on-insulator substrate. Additionally, the substrate may be made up of a single material or a combination of materials arranged in various formations such as, for example, stacks of multiple materials.

The substrate, according to other embodiments, may include, but are not limited to, wafers. The wafers may be of various suitable processing sizes. For example, substrate samples may be on the order of 1 inch or smaller, if desired. Additionally, full wafers of about 200 mm or about 300 mm in diameter, or even larger substrates may be incorporated.

The term substrate, as used herein, can broadly refer to any layer upon which processing is desired. Thus, for example, a native oxide film on the surface of a silicon substrate may itself be considered a substrate for the purposes of this discussion. Likewise, layers deposited on silicon or on other base substrates may likewise be considered substrates in certain embodiments. For example, in certain embodiments a multi-layer stack may be formed and then atomic layer etching may be performed on the top layer of the stack. In such a case, the top layer may be considered the substrate. In general, the layer or layers upon which the chemical precursor is deposited and/or which reacts with the chemical precursor can be considered the substrate layer(s).

According to certain embodiments, angstrom thick precursor layers can be used. For example, angstrom thick fluorocarbon (FC) layers can be deposited to a thickness of about 1 angstrom to about 3 nm to form a modified $SiO_2$ surface layer. The stoichiometry of the FC layers is variable, and they may include other elements not specifically called out, such as, for example, H. Subsequently, after establishing a gaseous environment of sufficient purity, such as, for example, by maintaining an Ar environment without additional precursor injection, low energy $Ar^+$ ion bombardment can be applied to remove portions of the FC layer, portions of the reacted $SiO_2$ layer, and controlled portions of the $SiO_2$ layer. This may be followed by another period during which an Ar gaseous environment of sufficient purity is established. Such a process can be repeated in a cyclical manner until a desired overall etching depth has been achieved. Further, low energy ion bombardment can be applied in various eV ranges, such as, for example, within a range of about 0 eV up to about 100 eV. In other embodiments, gases such as Ar, including Ne and/or Xe may also be applied.

Material etching can stop once the reacted $SiO_2$ surface layer has been removed, resulting in a self-limited process. Thus, according to certain embodiments, development of atomic layer etching processes for complex materials may be feasible.

In other embodiments, various other precursors may be applied in ALE. For example, other applicable precursors may include oxygen gas and fluorocarbon gas, such as, for example, $C_4F_8$, $C_4F_6$, or $CF_4$. In further embodiments, $CHF_3$, any $C_nF_mH_1$ or isomers thereof, or any $C_nO_mF_1$ gas or isomers thereof may be applied. Additionally, $Cl_2$ or at least one Br-based gas alone, or in combination with fluorocarbon gases may also be applied. Moreover, in other embodiments, the fluorocarbon gas may include at least one of $CH_4$, hydrofluorocarbon $C_nF_mH_1$ gas precursors or isomers thereof, or any $C_nO_mF_1$ gas precursors or isomers thereof, either alone or with admixtures of either $N_2$, $H_2$, $O_2$, CO, $CO_2$, noble gases, or $SiF_4$, alone or in combination.

To realize FC layer deposition on the order of angstrom, a pulsed FC injection into a low power Ar plasma may be used. For example, in certain embodiments, a pulsed $C_4F_8$ injection into a low power Ar plasma may be used. For an unbiased substrate, precise FC film thickness control in the 1 angstrom to 3 nm range may be possible by adjusting the total number $N_{C4F8}$ of $C_4F_8$ molecules entering the reactor of a plasma system by varying pulse duration and $C_4F_8$ gas flow rate appropriately. For these conditions, FC film thickness may increase linearly with $N_{C_4F_8}$.

To enable pulsed precursors with controlled, short pulse times, a specialized tool configuration may be necessary. When the pulse is injected into the processing chamber, the gas flow may be redirected from a dump line into the chamber, allowing for precise control of gas pulses, reactor pressure, and a stable flow rate.

Following FC deposition, a small radio frequency (RF) self-bias voltage may be applied for a predetermined amount of time. For example, in certain embodiments, a small RF self-bias voltage of −5, −10 and −15 V may be applied for 35 s. As a result, maximum ion energies of 20, 25 and 30 eV, respectively, may be created. For the low maximum ion energies, $Ar^+$ ion induced physical sputtering of unmodified $SiO_2$ may be negligible. At the end of a cycle, the process sequence may be repeated to achieve precise control over the total etched thickness.

According to other embodiments, controlled, self-limited etching of a polystyrene polymer using a composite etching cycle may be performed. In such embodiments, each etching cycle may consist of multiple steps. For example, in a first step, a modified surface may be produced by exposing the polymer surface to $O_2$. The oxygen may be adsorbed on the surface and form a reactive layer, especially if the polymer has already been modified by ion bombardment. Subsequently, in a second step, low-pressure Ar plasma etching may remove the oxygen-modified deposited reactive layer along with various amounts of the unmodified polymer, such as, for example, approximately 0.1 nm unmodified polymer.

Figure 1B:
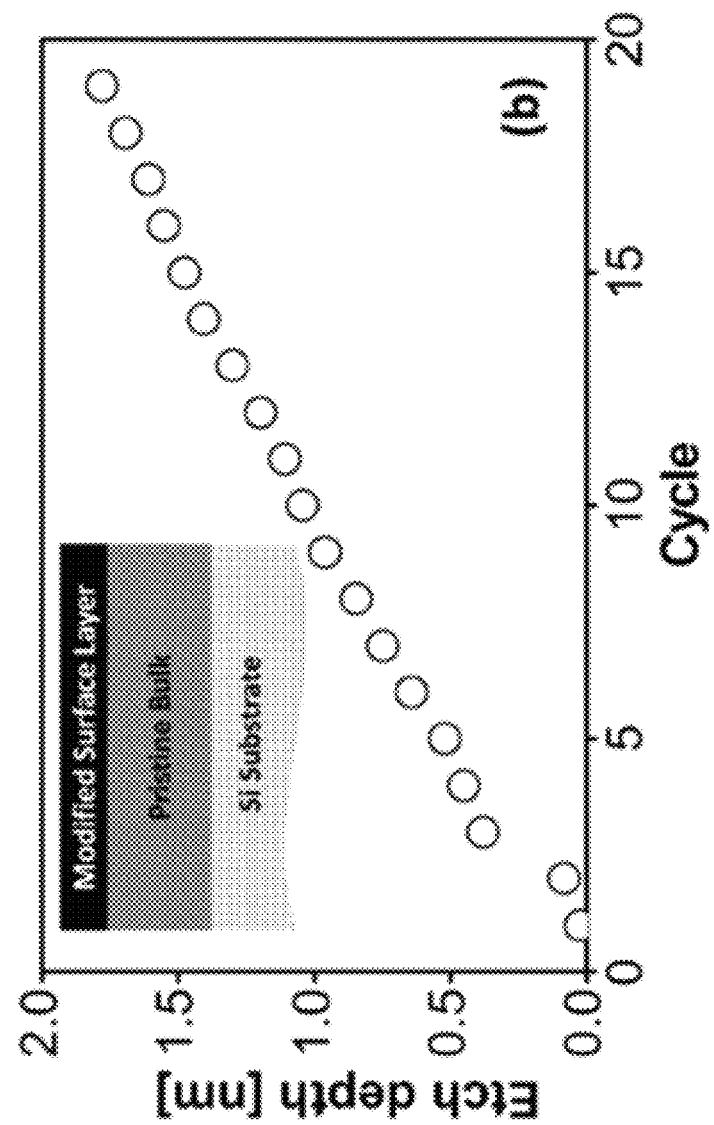
FIG. 1(b) illustrates the total etch depth of a polymer film versus etching cycle number using the same conditions as in FIG. 1(a), according to certain embodiments.

Moreover, in certain embodiments, an optical multilayer model may be used to extract the film thickness and complex index of refraction in real-time using in situ ellipsometry. The total etched thickness may increase linearly with the number of ALE cycles due to a roughly constant removed thickness per cycle. Excellent reproducibility and nearly constant etching depth per cycle is shown for twenty cycles, for example, in FIGS. 1(a) and 1(b), according to certain embodiments. Specifically, FIG. 1(a) illustrates real-time ellipsometry measurements for selected conditions of the etching approach, and FIG. 1(b) illustrates total etch depth of a polymer film versus etching cycle number using the same conditions as in FIG. 1(a).

To carry out ALE procedures, according to certain embodiments, various plasma system may be used. For example in certain embodiments, an inductively coupled plasma system may be used. In other embodiments, the plasma system may include capacitively coupled plasma systems, electron cyclotron resonance plasma systems, Helicon wave plasma systems, and electron-beam generated plasma systems. The plasma systems may also include magnetic enhancements and controllers configured to control an amount of chemical precursor deposition, and control the removal of portions of the chemical precursor layer(s), modified surface layer(s), and controlled portion of the substrate.

The plasma system may be excited at various frequencies, both high and low. For example, according to certain embodiments, the plasma system may be excited at 13.56 MHz. The base pressure achieved before processing may be in various ranges, such as, for example, the $1\times10^{-6}$ Torr range, and the temperature of the samples may be stabilized by substrate cooling during plasma processing.

Various materials may also be used with the plasma system. For example, $SiO_2$—Si—$SiO_2$ stacks deposited on an Si substrate may be used. The $SiO_2$—Si—$SiO_2$ stacks may be deposited on the Si substrate by plasma-enhanced chemical vapor deposition (PECVD) techniques and studied by in-situ ellipsometry in real time. In other embodiments, the various substrate materials described above may also be used.

Controlled deposition and chemical modification of the surface may allow selective removal of a sub-nm layer of $SiO_2$, where selective removal may be represented in terms of the material that is removed under the precursor layer, which has been modified, or is modified during the removal process. To establish strongly-time-dependent etch rates, a sequential approach may be used consisting of a thin FC layer deposition followed by a low energy $Ar^+$ ion etch for selective removal of volatile material.

Figure 2:
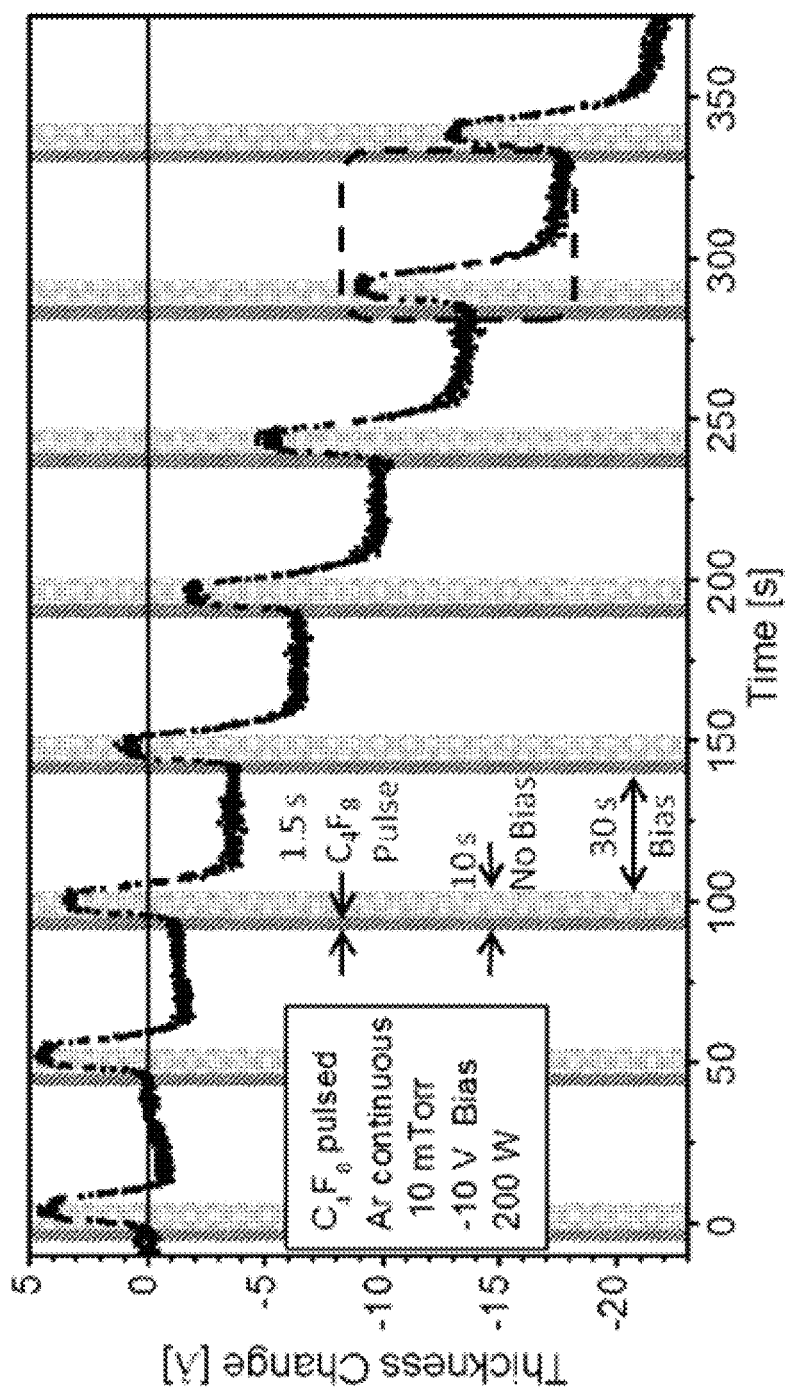
FIG. 2 illustrates a thickness evolution during eight cycles of a $SiO_2$ ALE process, according to certain embodiments.

FIG. 2 illustrates a thickness evolution for an $SiO_2$ layer for multiple cycles, along with the process parameters of one cycle, according to certain embodiments. At the beginning of each cycle, a pulse of $C_4F_8$ may be injected for 1.5 s into a continuous argon plasma, and deposits about 5 angstrom of FC film. A synchronized RF bias potential may be applied to the substrate 8 s after the $C_4F_8$ pulse to increase $Ar^+$ ion bombardment energies. This initiates FC film etching, and etching of the modified surface layer, followed by strongly time-dependent $SiO_2$ etching.

Etching or removal of the FC film and the modified surface layer, along with a controlled portion of the $SiO_2$ substrate may be uniform. For example, in certain embodiments, the surface roughness of FC layer, modified surface layer, layers of the $SiO_2$ may remain unchanged during etching.

FIG. 2 also illustrates that the initially high $SiO_2$ etch rate continuously decreases and finally ceases. The ion-induced reaction of deposited FC with $SiO_2$ may enable transient etching and controlled removal of an ultra-thin $SiO_2$ layer. Each cycle shows a similar behavior, although there are small systematic differences which will be further discussed below.

FIG. 2 further illustrates that the approach permits a high degree of control over total etched $SiO_2$ thickness. For instance, for $Ar^+$ ion energies of 20 eV, ion-induced removal of chemical reaction products may dominate etching, and unmodified $SiO_2$ may etch at a negligible rate.

According to certain embodiments, etching of $SiO_2$ for low energy ion conditions may be dominated by the fluorocarbon reactants and may result in an etch rate decrease with time until the initially deposited FC layer is depleted and etching ceases. This effect can be seen in the expanded views of single etching cycles for two conditions, as illustrated in FIGS. 3(a) and 3(b), according to certain embodiments.

Figures 3A, 3B:
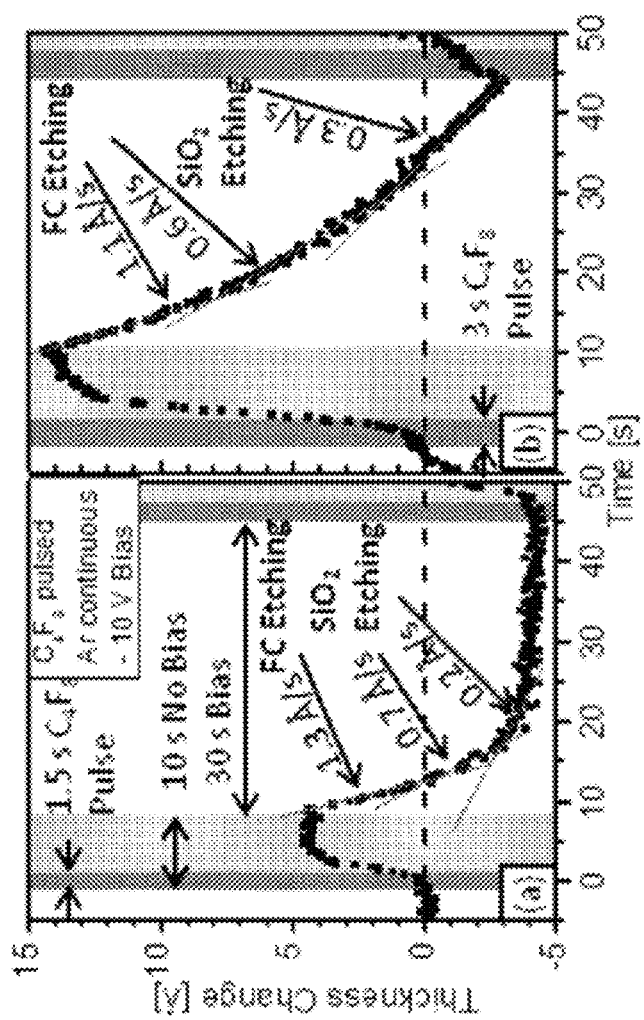
FIG. 3(a) illustrates thickness changes of fluorocarbon and $SiO_2$ during a single cycle of deposited fluorocarbon layer with a $C_4F_8$ pulse time of 1.5 s, according to certain embodiments.
FIG. 3(b) illustrates thickness changes of fluorocarbon and $SiO_2$ during a single cycle of deposited fluorocarbon layer with a $C_4F_8$ pulse time of 3 s, according to certain embodiments.

FIGS. 3(a) and 3(b) illustrate thickness changes of fluorocarbon and $SiO_2$ during a single cycle for two thicknesses of deposited FC layer achieved by changing the $C_4F_8$ pulse time from 1.5 s to 3 s, respectively. In FIG. 3(a), after deposition of 5 angstroms of FC, a bias potential of −10 V was applied. According to certain embodiments, the bias power may be supplied to a bottom electrode, which controls ion energies, and may be shut off during $C_4F_8$ injection. The low energy ions induce etching of the FC layer and additionally reaction of carbon and fluorine with the underlying $SiO_2$. The resulting modified $SiO_2$ surface layer was etched by low energy $Ar^+$ ion bombardment until the modified layer has been removed, when $SiO_2$ etching ceases. As shown in FIG. 3(b), a similar change in etch rate over time can be observed upon deposition of a thicker FC layer on $SiO_2$.

In certain embodiments, a steady-state may not be reached within the period the RF bias is applied. Therefore, even at the end of the etching cycle, FC material may still be present at the SiO$_2$ surface and enable a finite etch rate. This can be minimized by using shorter C$_4$F$_8$ pulses.

Precise admission of chemical reactants to the system can be an important factor in ALE. As such, it may be expected that residual FC deposited on the chamber walls may interfere with the management of chemical reactant supply at the substrate surface and reduce control over the etching process. For instance, FIG. 2 shows that the time-dependent etch rate during the second half of each cycle increases slightly from cycle to cycle. Residual FC entering the gas phase from the chamber walls between C$_4$F$_8$ pulses can redeposit on the exposed, unmodified SiO$_2$ and increase SiO$_2$ etching for FC reactant-starved process conditions in the later part of a cycle. Thus, maintaining a well-defined clean process chamber conditions to control supply of chemical reactants may be important for achieving ALE processes in a plasma reactor. Heating of the interior surfaces of the apparatus that surround the substrate along with additional pumping during periods with no bias to the substrate can improve chamber cleanliness and process control.

According to certain embodiments, to obtain insights on changes in surface chemistry throughout one cycle, X-ray photoelectron spectroscopy (XPS) may be performed after the FC deposition step, during the SiO$_2$ etch step, and after completion of a cycle. To study steady-state conditions, experiments were performed for the tenth cycle of a sequence. The results are shown in FIGS. 4(a) and 4(b), which summarize the different binding energy regions of interest (Si 2p, C 1s, O 1s, and F 1s).

Data are shown for 15 angstrom and 5 angstrom thick FC films in FIGS. 4(a) and 4(b), respectively. Si 2p and O 1s spectra were fit using SiO$_2$ and SiOF at 103.9 eV and 104.1 eV, and 533.2 eV and 533.4 eV, respectively. C 1s spectra were fit using C—C/H, C—CF$_x$, CF, CF$_2$, and CF$_3$ peaks at 285 eV, 287 eV, 289.1 eV, 291.2 eV, and 293.4 eV, respectively. F 1s spectra were fit using SiF$_x$, CF, and CF$_2$ at 687.8 eV, 686.9 eV and 689 eV, respectively.

Figure 4:
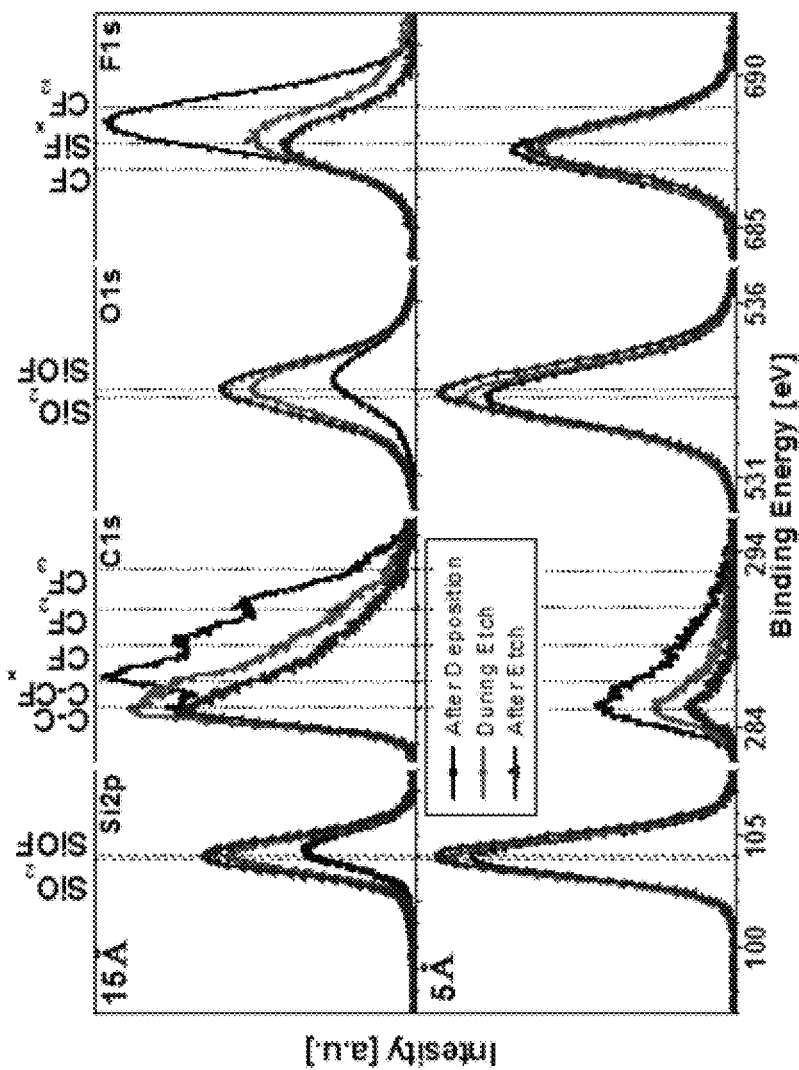
FIG. 4 illustrates XPS spectra comparing $SiO_2$ with thick 15 angstrom and thin 5 angstrom deposited fluorocarbon films after various steps of the tenth ALE cycle, according to certain embodiments.

According to certain embodiments, a reduction in F content can be seen throughout the etch step for a deposited film of 15 angstroms, as illustrated in FIG. 4. The C 1s spectra show a reduction in carbon-bonded fluorine. The Si 2p and O 1s signals increase correspondingly since they originate from the SiO$_2$ underneath the FC film. FIG. 4 also illustrates an SiO$_2$ surface covered with a thin FC film of 5 angstroms, according to certain embodiments. In particular, FIG. 4 shows little of the characteristic fluorocarbon bonding signature in the C 1s spectrum and only a slight F 1s signal reduction after etching in contrast to samples covered with a thick FC film. Since the C 1s spectrum shows the same reduction of carbon bonded to fluorine as the thicker films, the remaining fluorine must be associated with SiO$_2$. Bonding of fluorine with SiO$_2$ is shown by a slight shift of the Si 2p and O 1s spectra towards higher binding energy, consistent with the more electronegative environment.

Figures 5A, 5B, 5C, 5D, 5E, 5F, 5G, 5H, 5I:
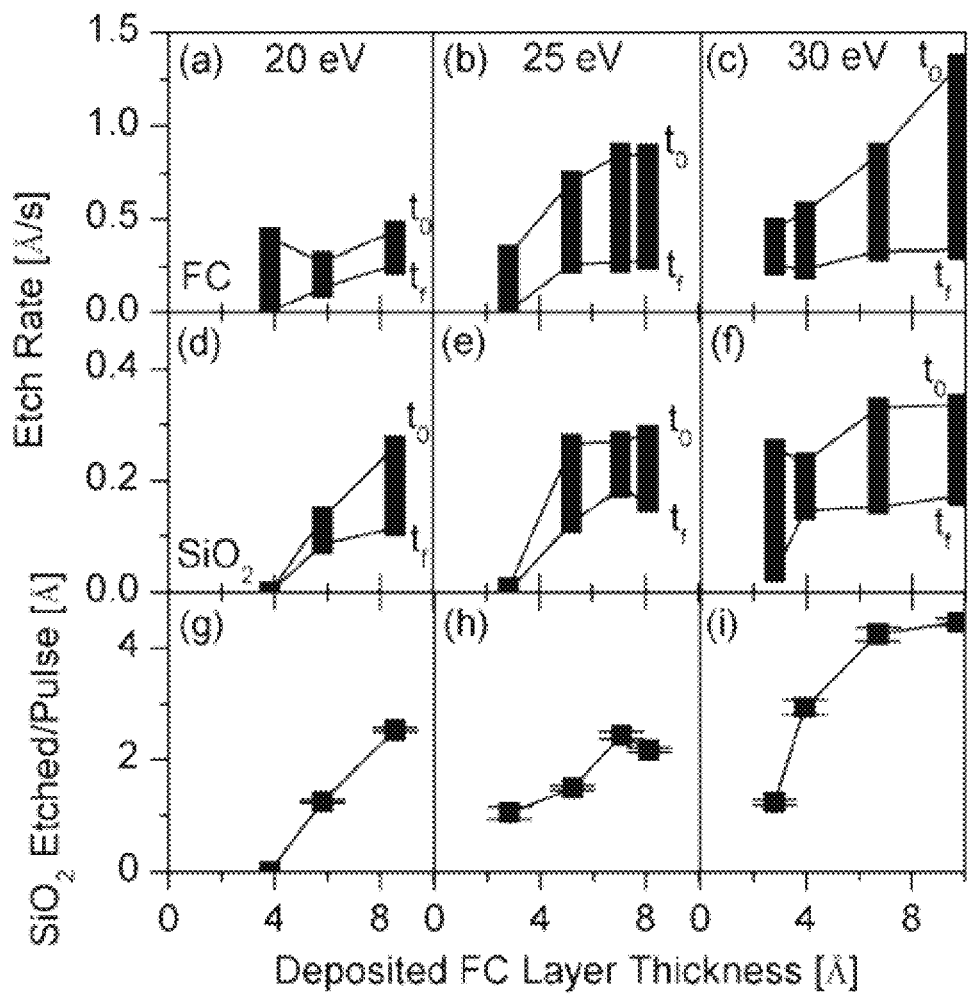
FIGS. 5(a)-5(c) illustrate the variation of fluorocarbon etching rates with fluorocarbon layer thickness and maximum ion energy, according to certain embodiments.
FIGS. 5(d)-5(f) illustrate the variation of $SiO_2$ etching rates with fluorocarbon layer thickness and maximum ion energy, according to certain embodiments.
FIGS. 5(g)-5(i) illustrate the variation of $SiO_2$ thickness removal, with fluorocarbon layer thickness and maximum ion energy, according to certain embodiments.

According to certain embodiments, the FC layer may play a critical role in enabling SiO$_2$ etching for the low energy ion bombardment conditions used. FIGS. 5(a)-5(c) summarize the variation of FC etching rates, FIGS. 5(d)-5(f) summarize the variation of SiO$_2$ etching rates, and FIGS. 5(g)-5(i) summarize the variation of SiO$_2$ thickness removal, with FC layer thickness and maximum ion energy. The time dependent etch rate within one cycle increases with FC film thickness and maximum Ar$^+$ ion energy.

Once a critical FC layer thickness on SiO$_2$ is reached, the FC reaction with SiO$_2$ no longer increases with FC film thickness, and SiO$_2$ etched per cycle may saturate. If the FC layer thickness exceeds this critical thickness, on the order of the projected range of Ar$^+$ ions in the FC material, the additional FC deposited may be etched by Ar$^+$ bombardment with little interaction with the SiO$_2$ underneath.

The impact of FC film thickness on SiO$_2$ etch rate may be seen in FIGS. 5(d), 5(e) and 5(f), which show an increase with both FC layer thickness and maximum ion energy. The maximum SiO$_2$ etch rate is not a strong function of total FC film thickness above 5 angstroms, but the minimum SiO$_2$ etch rate (achieved at the end of the cycle), depends strongly on FC film thickness. A deposited FC film thickness of 4 angstroms or less is required to achieve minimal SiO$_2$ etching at the end of the cycle at the low ion energies. FIGS. 5(a) to 5(i) show that the SiO$_2$ etch rate and SiO$_2$ thickness removed per etching cycle increase with maximum Ar$^+$ ion energy for a given FC layer thickness.

According to certain embodiments, using a steady-state Ar plasma, periodic injection of a defined number of C$_4$F$_8$ molecules and synchronized plasma-based Ar$^+$ ion bombardment, atomic layer etching of SiO$_2$ is possible. The thickness of a deposited FC layer in the range of 1 angstrom to 3 nm, and Ar$^+$ ion bombardment may be used to control the chemical modification of SiO$_2$, thus enabling etching of SiO$_2$ for low energy ion bombardment conditions for which the physical sputter rate of SiO$_2$ is negligible. In other embodiments it may be possible to measure the enhancement of the SiO$_2$ etch rate relative to the physical sputter rate at Ar$^+$ ion energies below 30 eV as a function of FC surface coverage. Results are consistent with computational simulations that first suggested the feasibility to achieve ALE for the fluorocarbon/Ar$^+$/SiO$_2$ system.

In order to control the deposited FC layer thickness, the C$_4$F$_8$ pulse length and flow rate may be adjusted. Longer pulses and/or higher flows admit more C$_4$F$_8$ molecules into the chamber, which may create a thicker FC layer.

Figure 6:
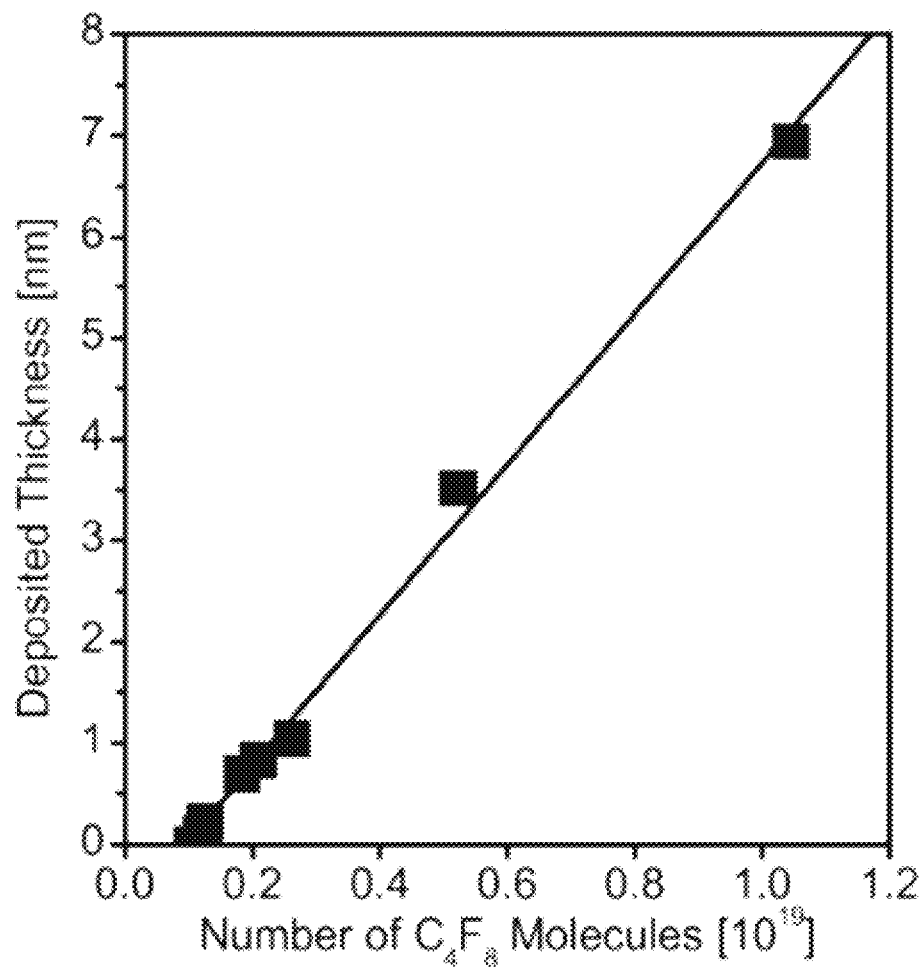
FIG. 6 illustrates the dependency of fluorocarbon deposition in each pulse on the amount of $C_4F_8$ admitted, according to certain embodiments.

FIG. 6 illustrates how the FC thickness depends linearly on the admitted amount of C$_4$F$_8$ in this regime of short pulses and low flows, according to certain embodiments. If the pressure in the dump line is significantly higher than the processing pressure, large amounts of precursor may be admitted to the chamber at the beginning of the pulse. The pressure in the dump line system can be adjusted by regulating the pump speed via a leak valve. In certain embodiments, the dump line system pressure may be adjusted to be similar to the processing pressure.

Figure 7B:
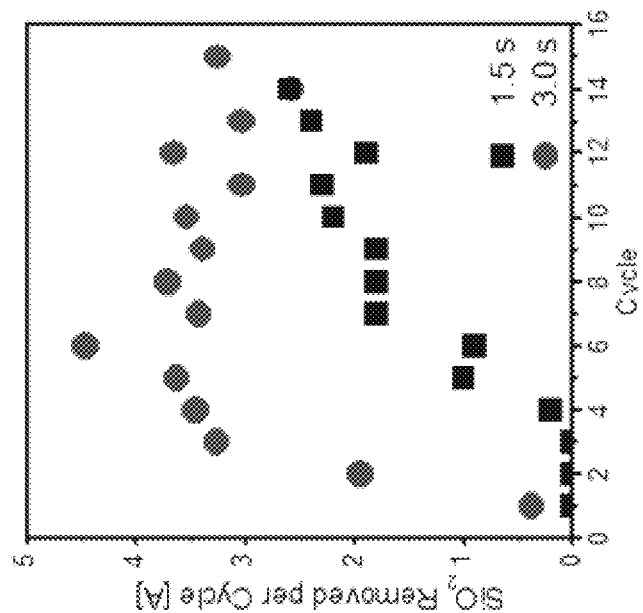
FIG. 7(*a*) illustrates deposition of fluorocarbon per cycle, according to certain embodiments.
Figure 7A:
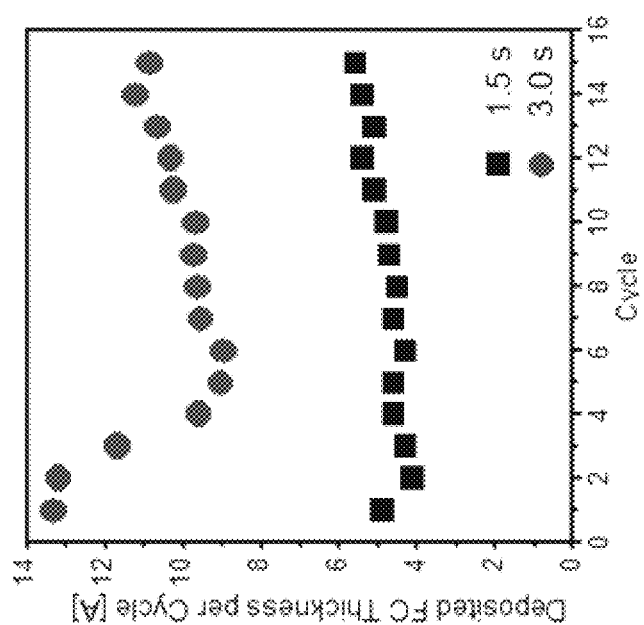

FIGS. 7(a) and 7(b) illustrate the influence of deposited FC layer thickness on SiO$_2$ etch rate at pulses of 1.5 s and 3.0 s, while the Ar ion bombardment time is 35 s in both cases, according to certain embodiments. In FIG. 7(a), thickness evolution of FC is shown during several cycles for two selected conditions of different pulse lengths and times in between consecutive pulses. Here, pristine SiO$_2$ cannot be etched with a pure Ar plasma at the low source powers and ion energies used. Thin FC film deposition can enable low energy ion etching of SiO$_2$. When admitting C$_4$F$_8$ to the processing chamber, a thin FC layer can be deposited until the precursor is depleted. The thin additional layer that may be removed as precursor from the precursor layer may be brought into contact with previously unreacted substrate, reacted, and then immediately removed. Subsequently, a bias power may be applied to the substrate to increase the ion energies. With the applied bias, the FC layer together with a thin SiO$_2$ layer may be rapidly etched.

The etch rate may decrease as the FC layer is removed together with a thin layer of SiO$_2$. Once the FC layer is fully removed, the etching ceases. Additionally, some negligible amount of unmodified substrate may be removed even without reacting with the precursor, as mentioned above. Subsequently, the next pulse deposits a new FC layer repeating the process. More specific effects are shown in FIG. 7(b), which show the removal of $SiO_2$ per pulse.

Figure 8:
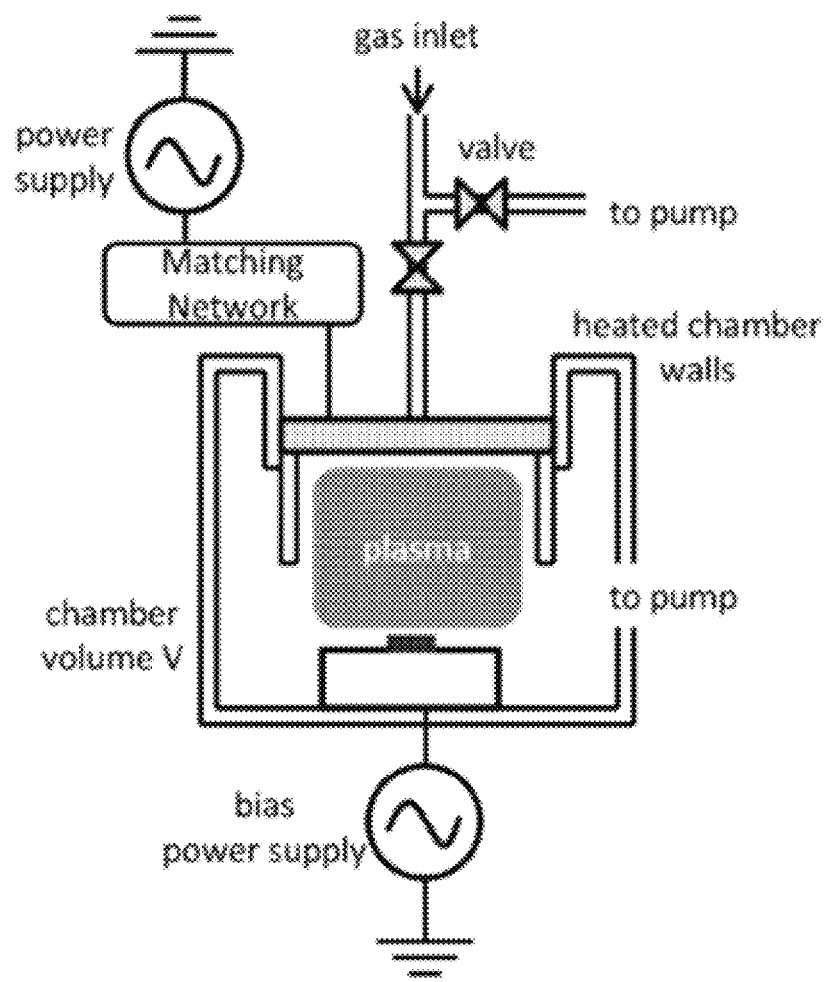
FIG. 8 illustrates high control through a specialized processing chamber with a small volume, temperate controlled chambered walls, and time modulated power supply, according to certain embodiments.

According to certain embodiments, time dependent modulation of various parameters and plasma properties may be necessary for high process control. Moreover, FIG. 8 illustrates that high control can be achieved through a feed gas setup and a specialized processing chamber with, for example, a small volume, temperature controlled inner surfaces of chamber walls, and time modulated power supply, according to certain embodiments.

Figure 9:
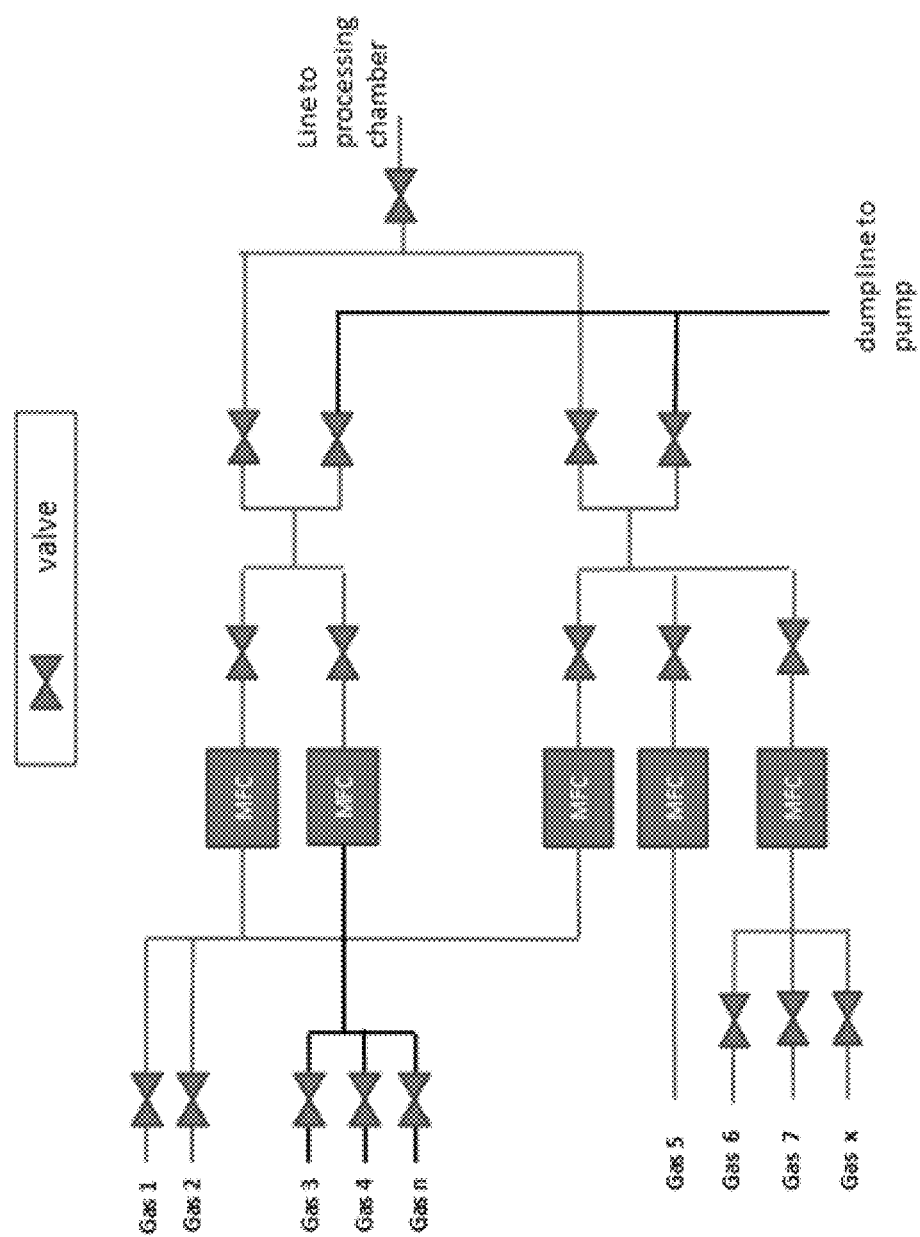
FIG. 9 illustrates a feed gas setup, according to certain embodiments.

FIG. 9 illustrates a possible feed gas setup enabling short, controlled precursor pulses, according to certain embodiments. In particular, the feed gas setup shows various gas lines with multiple valves and mass flow controllers (MFC) leading up to a line to the processing chamber, and a dump line to a pump.

Figure 10:
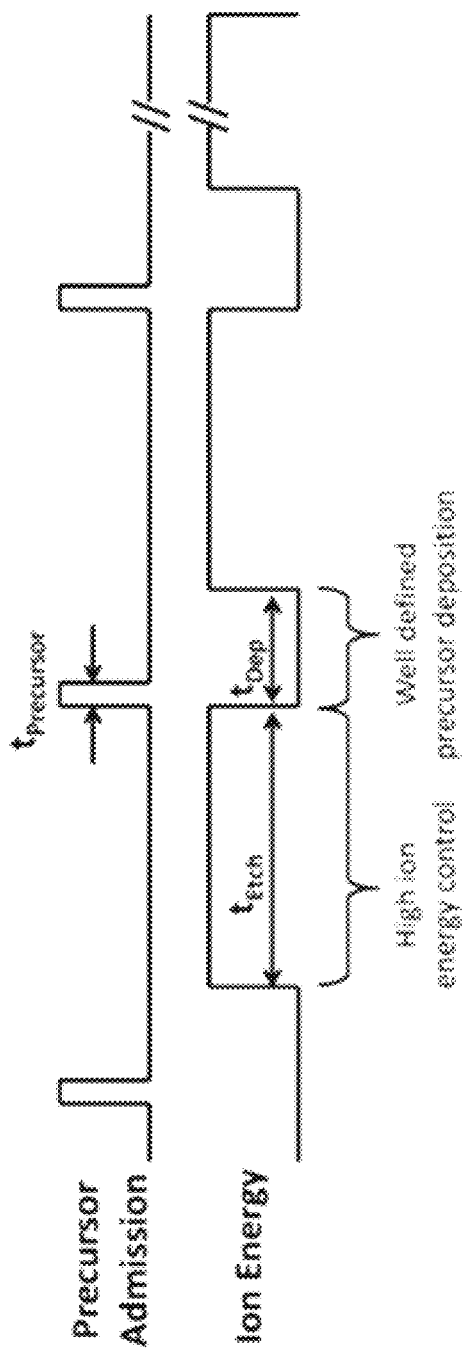
FIG. 10 illustrates a plasma based atomic layer etching procedure, according to certain embodiments.

FIG. 10 illustrates a plasma based atomic layer etching procedure, according to certain embodiments. In particular, according to FIG. 10, plasma based atomic layer etching may require great control over the precursor admission to the processing chamber, ion energies, and chamber condition. In certain embodiments, the cyclic approach may deposit a thin film enabling low energy ions to subsequently remove the topmost layer without a significant unmodified material etch.

Figure 11:
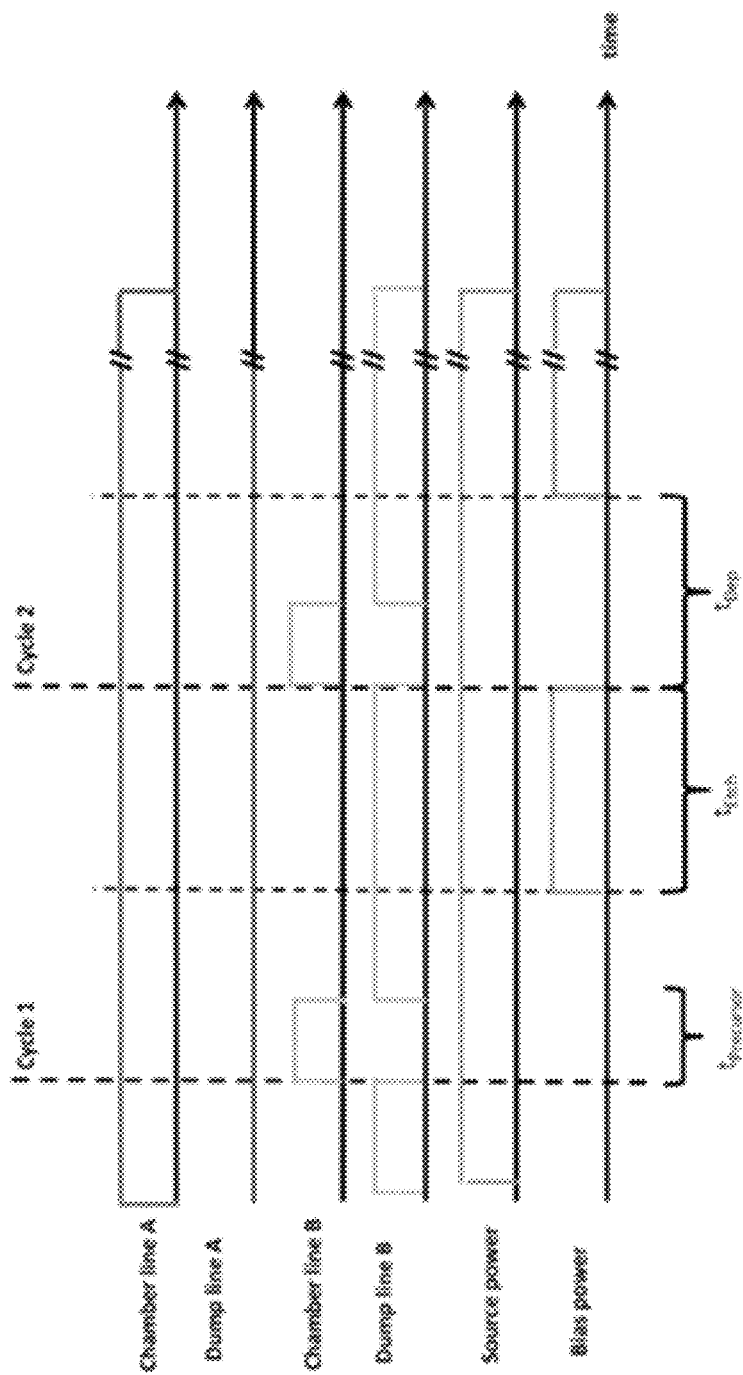
FIG. 11 illustrates a valve and power supply setup, according to certain embodiments.

FIG. 11 illustrates a valve and power supply setup, according to certain embodiments. In particular, lines A and B can both be independently activated as necessary. The source and bias power can also be activated as needed. Further, each time can be chosen according to the processing parameters to allow maximum flexibility. Additional possible delays can also be implemented.

Figure 12:
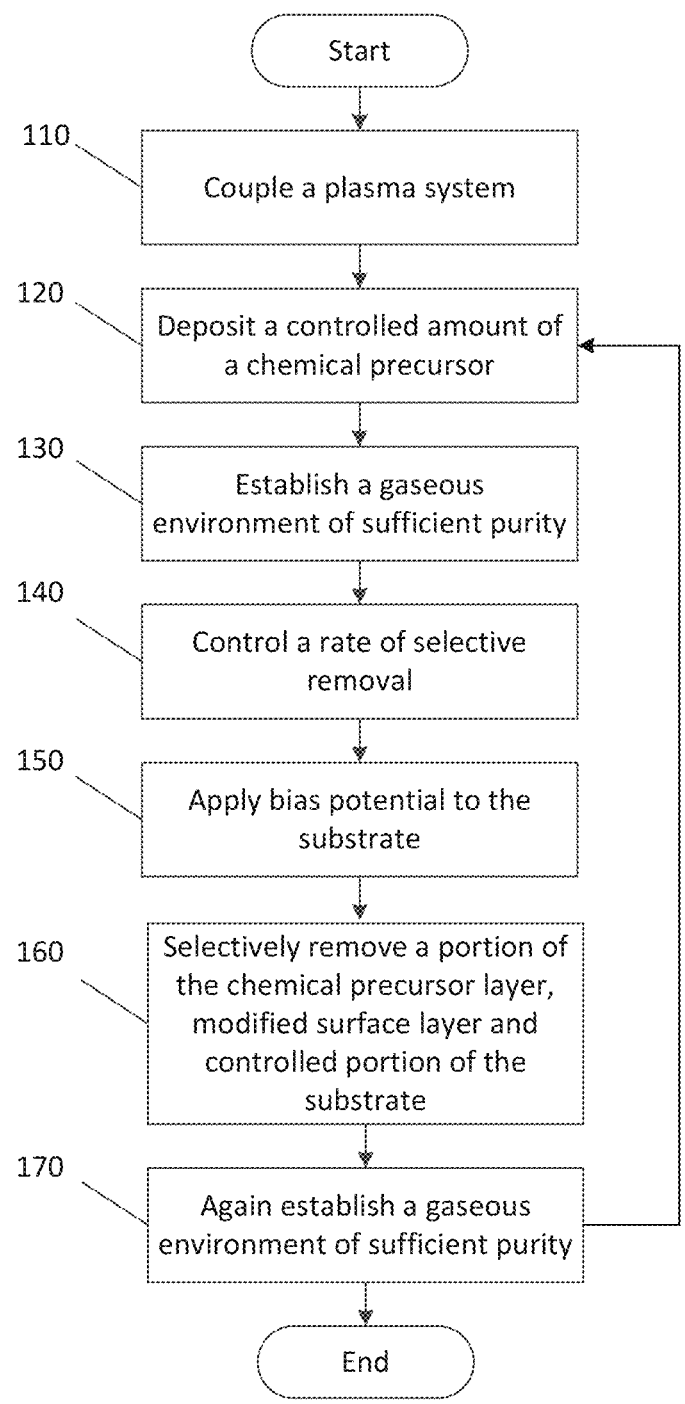
FIG. 12 illustrates a method according to certain embodiments.

FIG. 12 illustrates a method according to certain embodiments. As shown in FIG. 12, a method may include, at 110, coupling a plasma system to deposit the controlled amount of the chemical precursor. The method may also include, at 120, depositing a controlled amount of a chemical precursor on an unmodified surface layer of a substrate to create a chemical precursor layer and a modified surface layer. The method may further include, at 130, establishing a gaseous environment of sufficient purity. In certain embodiments, this can be done by maintaining an Ar environment without additional precursor injection. The method may also include, at 140, controlling a rate of selectively removing the portion of the chemical precursor layer, the portion of the modified surface layer, and the controlled portion of the substrate.

The method may also include, at 150, applying a bias potential to the substrate at a level configured to increase ion energies. The method may further include, at 160, selectively removing a portion of the chemical precursor layer, a portion of the modified surface layer, and a controlled portion of the substrate in a cyclical process. The method may also include, at 170, again establishing an Ar gaseous environment of sufficient purity. Once an Ar gaseous environment of sufficient purity is again established, the method may be repeated as a cyclical process beginning again from 120 until a desired overall etching depth is achieved. If desired, variations on pulse length and precursor thickness can vary from cycle to cycle. Thus, it is not required that all cycles be identical. However, in certain embodiments, the cycles may be identical if desired.

Figure 13:
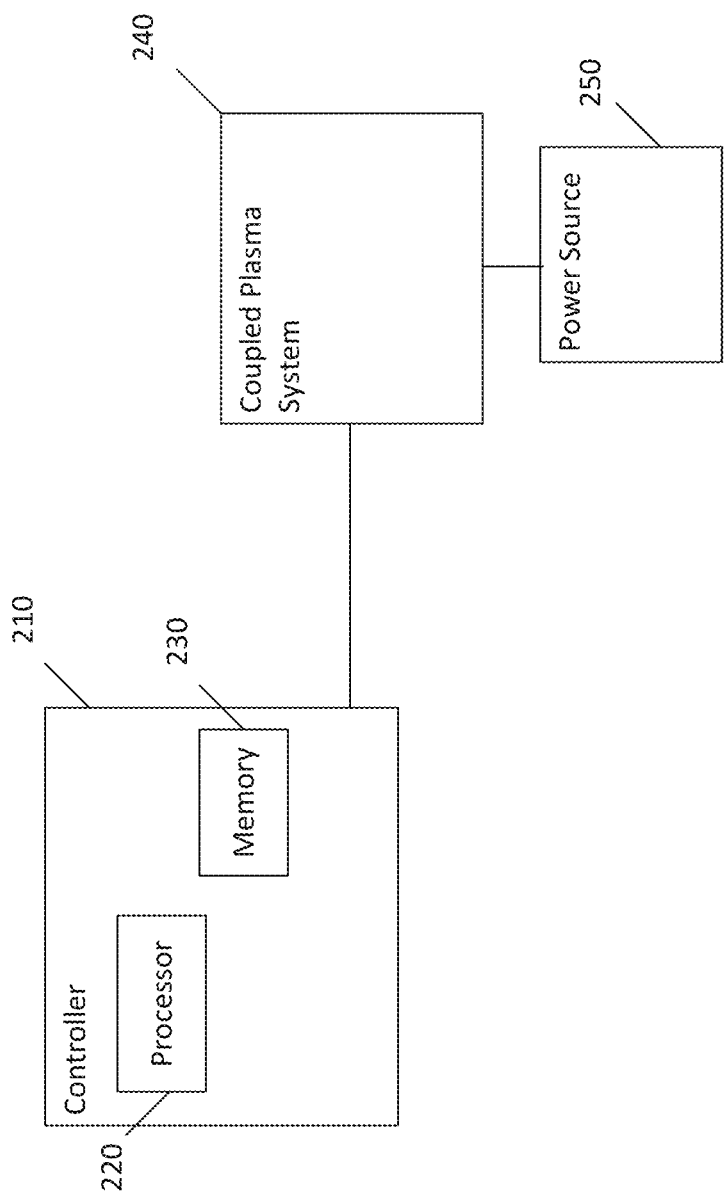
FIG. 13 illustrates a system according to certain embodiments.

FIG. 13 illustrates a system according to certain embodiments. In one embodiment, a system may include a coupled plasma system 240. The coupled plasma system 240 may be any plasma system mentioned above. The system may also include a power source 250. The power source 250 may be configured to supply a radio frequency bias potential to the substrate.

The system may also include a controller 210 that is connected to the coupled plasma system 240. The controller 210 may be configured to control an amount of the chemical precursor to be applied to the substrate, and also control the selective removal of portions of the chemical precursor layer, the modified surface layer, and the controlled portion of the substrate.

The controller 210 may include at least one processor 220. At least one memory 230 may be provided in the controller 210. The memory 230 may include computer program instructions or computer code contained therein. Other configurations of the controller 210 may also be provided.

The processor 220 may be a single or multiple core central processing unit (CPU). Memory 230 may be any suitable storage device, such as a non-transitory computer-readable medium. A hard disk drive (HDD), random access memory (RAM), flash memory, or other suitable memory may be used. Furthermore, the computer program instructions may be stored in the memory 230 and which may be processed by the processor 220 can be any suitable form of computer program code, for example, a compiled or interpreted computer program written in any suitable programming language. The memory or data storage entity is typically internal but may also be external or a combination thereof, such as in the case when additional memory capacity is obtained from a service provider.

The memory 230 and the computer program instructions may be configured, with the processor 220 for the particular device, to cause a hardware apparatus such as controller 210, to perform any of the processes described above (see, for example, FIG. 15). Therefore, in certain embodiments, a non-transitory computer-readable medium may be encoded with computer instructions or one or more computer program (such as added or updated software routine, applet or macro) that, when executed in hardware, may perform a process such as one of the processes described herein. Computer programs may be coded by a programming language, which may be a high-level programming language, such as objective-C, C, C++, C#, Java, etc., or a low-level programming language, such as a machine language, or assembler.

One having ordinary skill in the art will readily understand that the invention as discussed above may be practiced with steps in a different order, and/or where each individual step may be varied to achieve optimal performance of the overall process, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

GLOSSARY

ALE Atomic Layer Etching
CPU Central Processing Unit
FC Fluorocarbon
HDD Hard Disk Drive
MD Molecular Dynamics
MFC Mass Flow Controller
PECVD Plasma-enhanced Chemical Vapor Deposition RAM Random Access Memory
RF Radio Frequency
XPS X-Ray Photoelectron Spectroscopy

We claim:

1. A method, comprising:

depositing a controlled amount of a chemical precursor on an unmodified surface layer of a substrate to create a chemical precursor layer and a modified surface layer, the modified surface layer created by reactions between the unmodified surface layer and the chemical precursor; and selectively removing a portion of the chemical precursor layer, a portion of the modified surface layer, and a controlled portion of the substrate, wherein the controlled portion is removed to a depth ranging from about 1/10 of an angstrom to about 1 nm, and wherein the deposition and selective removal are performed under a plasma environment.

2. The method of claim 1, further comprising cyclically repeating the deposition of the controlled amount of the chemical precursor and the selective removal of the portion of the chemical precursor layer, the portion of the modified surface layer, and the controlled portion of the substrate until a desired overall etching depth is achieved.

3. The method of claim 1, further comprising controlling a rate of removal of material in the selective removal process.

4. The method of claim 1, wherein the chemical precursor is deposited in a plurality of pulse lengths using predetermined amounts of time and mass flows, and wherein the selective removal also accompanies the chemical precursor deposited in the cycles.

5. The method of claim 4, wherein a thickness of the deposited chemical precursor is about 1 angstrom to about 3 nm.

6. The method of claim 1, wherein the substrate comprises at least one material that shows chemically induced etching in the presence of low energy ion bombardment and the chemical precursor.

7. The method of claim 1, wherein the substrate comprises at least one of SiO2, Si3N4, c-Si, amorphous Si, polycrystalline Si, SixGe1−x, GaAs or other group III-V semiconductors, GaAlxAs1−x, InGaAs1−x, GaPxAs1−x, or the oxides, nitrides, or oxynitrides of the above materials.

8. The method of claim 1, wherein the substrate comprises a native oxide layer on the surface of the substrate, and wherein the native oxide layer has a thickness of about 1/10 of 1 nm to about 10 nm.

9. The method of claim 1, wherein the substrate comprises high-k dielectric films.

10. The method of claim 1, wherein the substrate comprises low-k dielectric films, with or without nanopores.

11. The method of claim 9, wherein the substrate comprises at least one of SiCOH, SiOyFx, or polymeric low-k dielectric films, with or without nanopores.

12. The method of claim 9, wherein the high-k dielectric films comprises Al2O3, HfO2, or Hf-silicate.

13. The method of claim 1, wherein the substrate comprises at least one of graphene, graphite and other forms of carbon, deposited on a Si or silicon-on-insulator substrate.

14. The method of claim 1, further comprising coupling a plasma system to deposit the controlled amount of the chemical precursor, and selectively remove the portion of the chemical precursor layer, the portion of the modified surface layer, and the controlled portion of the substrate.

15. The method of claim 1, further comprising applying a bias potential to the substrate at a level configured to increase ion energies, wherein the bias potential is synchronized to the deposition of the controlled amount of the chemical precursor.

16. The method of claim 1, wherein the chemical precursor comprises at least one of a fluorocarbon gas, oxygen-, or bromine-based gas.

17. The method of claim 16, wherein the fluorocarbon gas comprises at least one of the hydrofluorocarbon gas $C_nF_mH_1$ precursors or isomers thereof, or any $C_nO_mF_1$ gas precursors or isomers thereof, either alone or with admixtures of either $N_2$, $H_2$, $O_2$, CO, $CO_2$, noble gases, $CH_4$, or $SiF_4$, alone, or in combination.

* * * * *